US006405355B1

(12) United States Patent
Duggirala et al.

(10) Patent No.: US 6,405,355 B1
(45) Date of Patent: Jun. 11, 2002

(54) METHOD FOR PLACEMENT-BASED SCAN-IN AND SCAN-OUT PORTS SELECTION

(75) Inventors: Suryanarayana Duggirala, San Jose; Rohit Kapur, Cupertino, both of CA (US); Thomas W. Williams, Boulder, CO (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/283,095

(22) Filed: Mar. 31, 1999

Related U.S. Application Data

(63) Continuation-in-part of application No. 09/275,502, filed on Mar. 24, 1999.

(51) Int. Cl.[7] .............................................. G01R 31/28

(52) U.S. Cl. ........................................... 716/8; 716/12

(58) Field of Search ................................ 714/724, 726; 716/4, 12, 18, 8

(56) References Cited

U.S. PATENT DOCUMENTS

| 5,726,996 | A | * | 3/1998 | Chakradhar et al. | ........ | 714/724 |
| 5,812,561 | A | * | 9/1998 | Giles et al. | ................ | 714/726 |
| 5,983,376 | A | * | 11/1999 | Narayanan et al. | ......... | 714/726 |
| 6,067,650 | A | * | 5/2000 | Beausang et al. | ........... | 714/726 |

OTHER PUBLICATIONS

"A New Approach to Scan Chain Reordering Using Physical Design Information," Beausang et al., International Test Conference, IEEE, 1998.*
"Scan Insertion Criteria for Low Design Impact" Barbagallo et al., 14th VLSI Test Symposium, IEEE, 1996.*

* cited by examiner

Primary Examiner—N. Le
Assistant Examiner—Walter Benson
(74) Attorney, Agent, or Firm—Wagner Murabito & Hao LLP

(57) ABSTRACT

A computer implemented method of constructing a scan chain. According to the present invention, scan cells are inserted into a netlist description of an integrated circuit design and are coupled serially together to form a scan chain. The resulting netlist is then passed to layout processes where the cells of the integrated circuit design are automatically placed and routed. The layout processes are performed without regard to any predetermined constraints designating any particular functional pins of the netlist design as scan-in or scan-out ports for the scan chain. After the cells are placed, a first functional pin is selected as the scan-in port and a second functional pin is selected as the scan-out port according to cell placement information. In particular, the functional pin that is closest to the leading scan cell is selected as the scan-in port. The functional pin that is closest to the last scan cell is selected as the scan-out port for the scan chain. Scan-in functionalities are then added to the first functional pin and scan-out functionalities are added to the second functional pin. The present invention thereby improves cell placement and wire routability, and allows a better integrated circuit to be designed and fabricated.

22 Claims, 14 Drawing Sheets

METHOD FOR PLACEMENT-BASED SCAN-IN AND SCAN-OUT PORTS SELECTION

RELATED US APPLICATION

The instant application is a continuation-in-part of U.S. patent application Ser. No. 09/275,502, filed on Mar. 24, 1999, and entitled "System and Method for High-Level Test Planning for Layout," by Duggirala et al., and assigned to the assignee of the present invention.

FIELD OF THE INVENTION

The field of the present invention pertains to the field of electronic design automation. More particularly, the present invention pertains to test and floorplanning equivalent processes within the field of electronic design automation of integrated circuit devices.

BACKGROUND OF THE INVENTION

The rapid growth of the complexity of modern electronic circuits has forced electronic circuit designers to rely upon computer programs to assist and automate most steps of the circuit design process. Typical modem circuits contain hundreds of thousands or millions of individual pieces or "cells." Such a design is much too large for a circuit designer or even an engineering team of designers to manage effectively manually. To automate the circuit design and fabrication of integrated circuit devices, electronic design automation (EDA) systems have been developed.

An EDA system is a computer software system designers use for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated by the EDA system into a lower level technology-specific netlist based on a technology-specific library that has gate-specific models for timing and power estimation. A netlist describes the IC design and is composed of nodes (elements) and edges, e.g., connections between nodes, and can be represented using a directed cyclic graph structure having nodes which are connected to each other with signal lines. The netlist is typically stored in computer readable media within the EDA system and processed and verified using many well known techniques. The netlist is then used to generate a physical device layout in mask form which can be used to directly implement structures in silicon to realize the physical IC device.

As ASICs and other complex integrated circuits have become more complex and more dense, they have become progressively harder to test in order to ensure correct and complete functionality. For example, with current technology, as the number of gates and transistors increase, the time which an ASIC spends in testing increases as well. This increase incurs an additional cost on ASIC manufacturing. The testing cost can be very significant for the latest and largest ASIC designs. In addition, as more complex systems-on-a-chip devices proliferate, which, for example, integrate complex logic units (integer units, floating point units, memory, etc.) into a single chip, and as newly-designed processors begin to take advantage of the ability to integrate large quantities of memory on-chip, it has become necessary to increase the comprehensiveness, efficiency, and accuracy of the design checking and testing schemes utilized to ensure proper operation of these devices (e.g., ASICs, complex integrated circuits, field programmable gate arrays, etc.).

Thus, an increasingly important part of the logic synthesis process involves designing for testability. Programs that aid in the testability process of logic synthesis are called. design for test (DFT) processes. One approach to DFT is to take the netlist generated from a compiler and add and/or replace certain memory cells and associated circuitry with special memory cells that are designed to allow the application of test vectors to certain logic portions of the integrated circuit. Test vectors are applied to the design and the special memory cells and associated circuitry are referred to as DFT implementations. The same memory cells can be used to capture the output of the circuitry for observation and compare this output to the expected output in an effort to determine if circuit (e.g., manufacturing) defects are present. Issues concerning controllability deal with facilitating the application of the test vectors to the circuitry to be tested. On the other hand, issues concerning observability deal with facilitating the capturing the output of the circuitry.

The portions of an integrated circuit that are designed to perform its intended or expected operational function are called its "mission mode" circuitry, while the portions added to the integrated circuit to facilitate testability are called "test mode" circuitry or DFT implementations. The resultant circuit, therefore, has two functional modes, mission and test.

An exemplary flow chart diagram of a typical design automation process 100, including a DFT process, is shown in FIG. 1. The process 100 described with respect to this flow chart is implemented within a computer system in a CAD environment. Within the process 100, a circuit designer first generates a high-level description 105 of a circuit in a hardware description language such as VHDL or Verilog. The high-level description 105 is then converted into a netlist 115 by using a computer implemented synthesis process 110 such as the "Design Compiler" available from Synopsys, Inc., of Mountain View, Calif. A netlist 115 is a description of the electronic circuit which specifies what cells compose the circuit and which pins of which cells are to be connected together using interconnects ("nets"). At this point the netlist 115 consists of "mission mode" circuitry.

At block 120, a constraint-driven scan insertion process is performed to implement testability cells or "test mode" cells into the overall integrated circuit design. In this process 120, memory cells of the netlist 115 are replaced with scannable memory cells that are specially designed to apply and observe test vectors or patterns to and from portions of the integrated circuit. In addition, process 120 performs linking groups of scannable memory cells ("scan cells") into scan chains so that the test vectors can be cycled into and out of the integrated circuit design. The output of the scan insertion process 120 is a scannable netlist 125 that contains both "mission mode" and "test mode" circuitry. Scan insertion process 120 also selects existing functional pins to be used as scan-in and scan-out-ports based on schematic information.

The scannable netlist 125, however, does not contain any information with respect to the physical design of the circuit. For example, the netlist 125 does not specify where the cells are placed on a circuit board or silicon chip, or where the interconnects run. Determining this physical design information is the function of a computer controlled layout process 130.

The layout process 130 first finds a location for each cell on a circuit board or silicon chip. This is called "placement." The locations are typically selected to optimize certain objectives such as wire length, circuit timing, power consumption, and/or other criteria, and subject to the condition that the cells are spread evenly over the circuit board or silicon chip and that the cells do not overlap with each other. The layout process 130 also generates the wire geometry based on the placement information for connecting the pins of the cells together. The output of the automatic cell layout process 130 includes cell placement data structures and wire geometry data structures 135 that are used to make the final geometric database needed for fabrication of the circuit as shown by process 140.

In some cases, the layout of a typical design is not influenced by the test mode logic. Therefore, the layout process 130 in some cases may break up the scan chains and place the scan cells in such a way that the layout of the mission mode circuitry is not affected. The layout process 130 then reconnects the scan chain based on the placement of the scan cells. This process is also known as placement-based scan chain re-ordering.

One problem associated with process 100 is that the scan-in and scan-out ports used by scan-insertion process 120, which are typically assigned according to schematic information, may not be ideal. For example, the layout process 130 may not be able to optimize certain wire length or circuit timing objectives if inappropriate scan-in and scan-out are used. In addition, poor assignment of the scan-in and scan-out ports may restrict the layout processes from placing scan cells in the best possible positions, and may restrict the placement-based scan chain re-ordering process from determining the best possible ordering of the scan cells.

Accordingly, there exists a need for an IC design automation process that optimizes placement of the scan cells while emphasizing wire routability and circuit timing. What is further needed is an improved process for determining the scan-in and scan-out ports for a scan chain that does not restrict the layout processes and scan-chain re-ordering processes from determining the best placement and best ordering of the scan cells. What is also needed is an improved process for selecting scan-in and scan-out ports for a scan chain such that wire lengths and routing congestion are reduced.

SUMMARY OF THE INVENTION

The present invention provides an improved IC design automation process that optimizes placement of the scan cells while emphasizing wire routability and circuit timing. The present invention also provides a method of selecting scan-in and scan-out ports that allows the scan cells to be placed in the best possible position and allows scan-chain re-ordering processes to determine the best possible ordering for the scan chain. In addition, the present invention provides a method of selecting scan-in and scan-out ports for a scan chain such that wire lengths and routing congestion are reduced. These and others advantages of the present invention not specifically mentioned above will become clear within discussions presented herein.

According to one embodiment of the present invention, scan cells are inserted into a netlist description of an integrated circuit design and are coupled serially together to form a scan chain. The resulting netlist is then passed to layout processes where the cells of the integrated circuit design are automatically placed and routed. Significantly, the layout processes are performed without regard to any constraints that designate particular functional pins as scan-in and scan-out. In accordance with the present invention, scan-in and scan-out ports are then selected based on the placement of the scan cells such that routing wire lengths and routing congestion are minimized. Thus, by avoiding predefined scan-in and scan-out processes, the present invention improves cell placement and wire routability and allows a better integrated circuit to be designed and fabricated.

In another embodiment of the present invention, scan cells of a scan chain are re-ordered based on placement information during the layout processes. Importantly, the layout processes (including placement processes and scan chain re-ordering processes) are performed without regard to any constraint or definition that designates particular functional pins as scan-in and scan-out ports. Scan-in and scan-out ports of the re-ordered scan chain are subsequently selected based on the final placement of the scan cells such that routing wire lengths and routing congestion are minimized. In particular, the port selected as the scan-in port is the port closest to the final position of the leading scan cell of the scan chain. The port selected as the scan-out port is the port closest to the final position of the last scan cell of the scan chain. In this manner, an even more effective cell placement can be achieved.

In yet another embodiment of the present invention, place-and-route processes, scan-chain re-ordering processes and ports selection process are performed without regard to any constraints designating any functional pin as scan-in and scan-out. Rather, these processes use the wirelengths from the functional pins to the scan cells as constraints when placing and re-ordering the scan cells, and when selecting scan-in and scan-out ports for the scan chain. The best placement, scan-chain order and scan-in and scan-out ports can then be determined heuristically.

In yet another embodiment, the scan cells of the scan chain are partitioned into sets of re-orderable scan cells. Data representative of the resulting sets is then provided to layout processes and therein the scan cells of the scan chain are re-ordered based on the sets. Further, the layout processes are performed without regard to any constraints that designate particular functional pins as scan-in and scan-out. After the scan cells are placed, functional pins are selected and used as scan-in and scan-out ports of the re-ordered scan chain such that routing wire length and routing congestion are reduced. In this manner, the efficiency and effectiveness of the layout processes is improved.

Embodiments of the present invention include the above and further include an improved computer-aided design (CAD) system that inserts a scan chain within an integrated design, and places and routes the integrated circuit design to determine its layout without regard to any predetermined constraint designating a functional pin as a scan-in port or a scan-out port for the scan chain. Rather, the CAD system selects the scan-in and scan-out ports based on placement. The CAD system then modifies the netlist description of the integrated circuit design to add scan-in functionality and scan-out functionality to the selected functional pins, thereby improving cell placement and wire routability, and allowing a better designed integrated circuit to be designed and fabricated.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE PREFERRED EMBODIMENTS

In the following detailed description of the preferred embodiments, for purposes of explanation, numerous specific details are set forth in order to provide a thorough understanding of the present invention. However, it will be apparent to one skilled in the art that the present invention may be practiced without these specific details. In other instances, well-known structures and devices are not described in detail in order to avoid obscuring aspects of the present invention.

I. NOTATION AND NOMENCLATURE

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here and generally conceived to be a self-consistent sequence of steps of instructions leading to a desired result. The steps are those requiring physical manipulations of data representing physical quantities to achieve tangible and useful results. It has proven convenient at times, principally for reasons of common usage, to refer to these signals as bits, values, elements, symbols, characters, terms, numbers or the like.

It should be borne. in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving", "determining", "generating", "associating", "assigning" or the like, refer to the actions and processes of a computer system, or similar electronic computing device. The computer system or similar electronic device manipulates and transforms data represented as electronic quantities within the computer system's registers and memories into other data similarly represented as physical quantities within the computer system memories into other data similarly represented as physical quantities within the computer system memories or registers or other such information storage, transmission, or display devices.

II. COMPUTER SYSTEM PLATFORM

Figure 2:
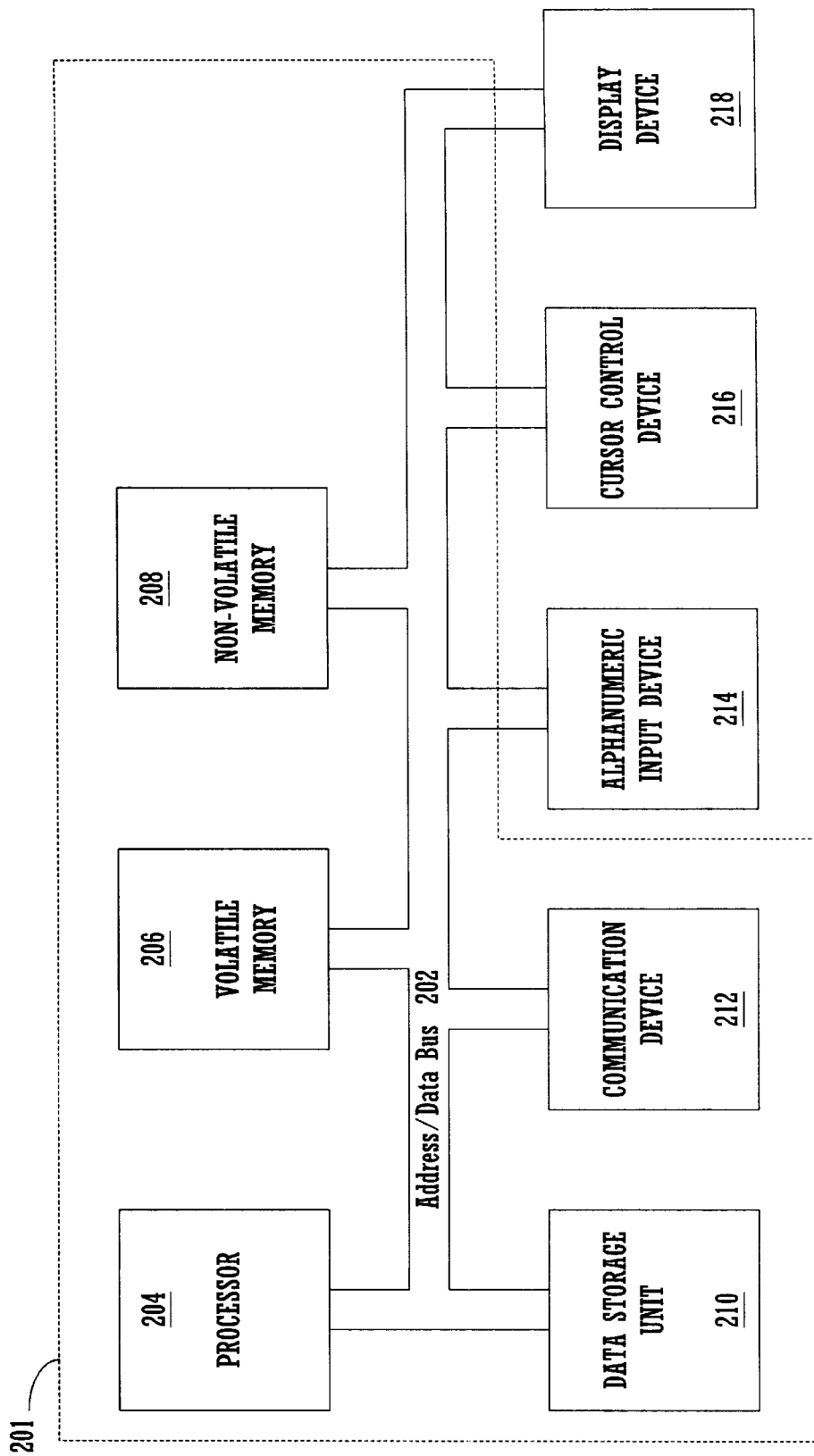
FIG. 2 is a computer-aided design (CAD) system including a computer system opera as a platform on which embodiments of the present invention may be implemented.

Specific aspects of the present invention are operable within a programmed computer aided design (CAD) system. A CAD system operable as a platform to implement and support elements of the present invention is shown in FIG. 2. In general, the CAD system of the present invention includes a general purpose computer system 201 which includes an address/data bus 202 for communicating information including address, data, and control signals, a central processor 204 coupled with bus 202 for processing information and instructions, a volatile memory 206 (e.g., random access memory RAM) coupled with the bus 202 for storing information and instructions for the central processor 204 and a non-volatile memory 208 (e.g., read only memory ROM) coupled with the bus 202 for storing static information and instructions for the processor 204, a data storage device 210 such as a magnetic or optical disk and disk drive coupled with the bus 202 for storing information and instructions, an optional display device 218 coupled to the bus 202 for displaying information to the computer user, an optional alphanumeric input device 214 including alphanumeric and function keys coupled to the bus 202 for communicating information and command selections to the central processor 204, an optional cursor control or directing device 216 coupled to the bus 202 for communicating user input information and command selections to the central processor 204, and a communication device 212 coupled to the bus 202 for communicating signals that are input and output from the system 201.

Program instructions executed by the CAD system can be stored in computer usable memory units such as RAM 206, ROM 208, or in the storage device 210, and when executed in a group can be referred to as logic blocks or procedures. It is appreciated that data produced at the various logic synthesis stages of the present invention, including representations of the different levels of abstraction of the integrated circuit design, such as a netlist and or re-ordering limitations and/or sets of scan cells, can also be stored in RAM 206, ROM 208 or the storage device 210 as shown in FIG. 2.

The display device 218 of FIG. 2 utilized with the computer system 201 of the present invention is optional and may be a liquid crystal device, cathode ray tube, or other display device suitable for creating graphic images and alphanumeric characters recognizable to the user. The cursor control device 216 allows the computer user to dynamically signal the two dimensional movement of a visible pointer on a display screen of the display device 218. Many implementations of the cursor control device are known in the art including a trackball, mouse, joystick or special keys on the alphanumeric input device 214 capable of signaling movement of a given direction or manner of displacement.

III. SCAN-CHAIN PARTITIONING FOR SCAN CHAIN REORDERING

Figure 3:
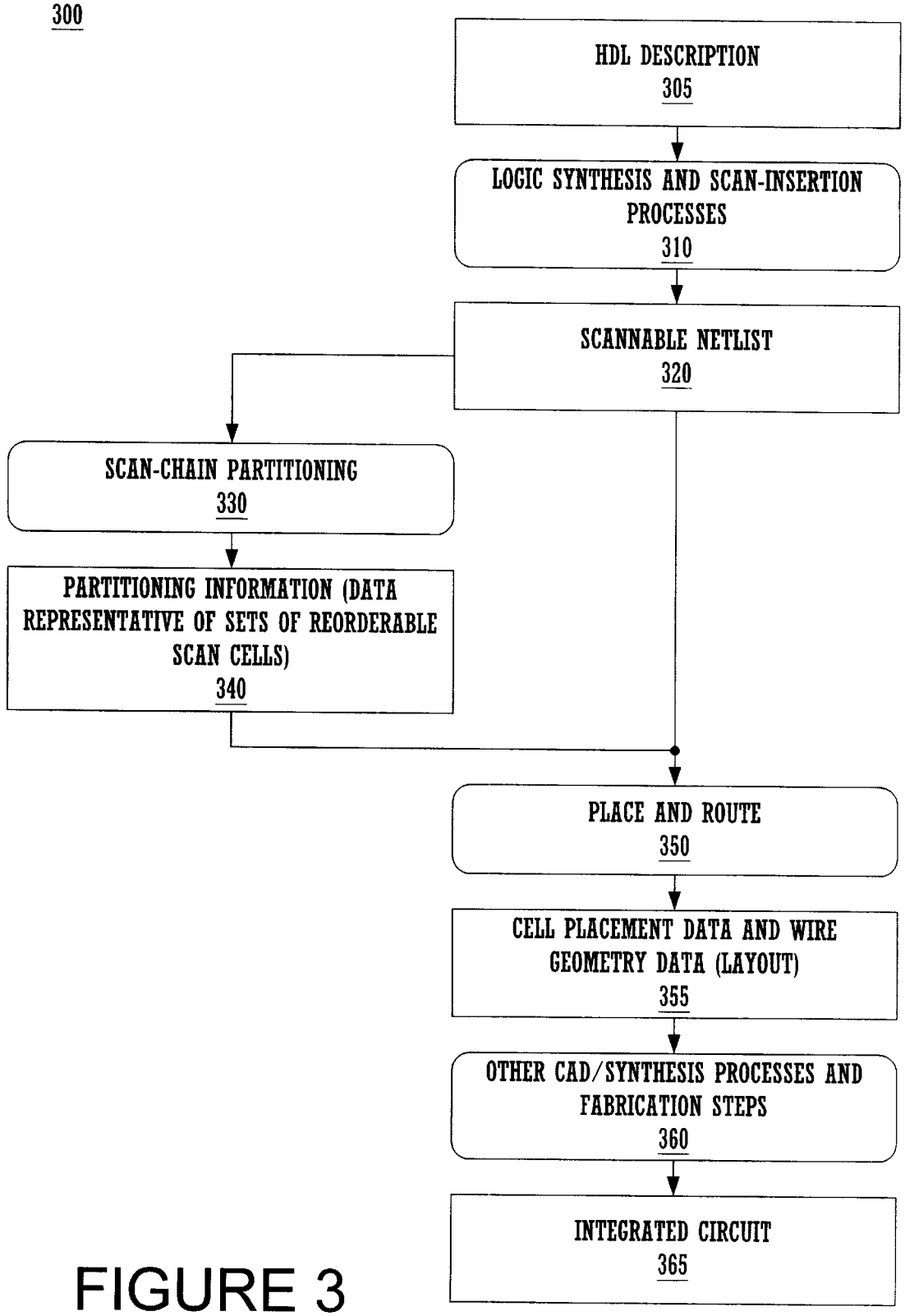
FIG. 3 is a flow chart diagram illustrating a test mode circuitry place-and-route process in accordance with the present invention.

FIG. 3 is a flow, diagram of a process 300 in accordance with embodiments of the present invention and its logic blocks are implemented within the computer controlled CAD system described above. As illustrated, an HDL description 305 of an integrated circuit design is input into a synthesis and scan-insertion block 310. Synthesis processes of block 310 may include well known procedures such as HDL compiling procedures, logic optimization procedures, and mapping procedures.

Block 310 further includes scan-insertion processes (also called test insertion) for implementing testability cells or "test mode" cells into the overall integrated circuit design. In these processes, memory cells of the design are replaced with scannable memory cells and other logic that are specially designed to apply and observe test vectors or patterns to and from portions of the integrated circuit. In one particular DFT process, these scannable memory cells specially designed for test are called scan cells. Scan-insertion processes of block 310 also link groups of scan cells into respective scan chains so that the test vectors can be cycled into and out of the integrated circuit design. The output of the scan insertion processes is a scannable netlist 320 that contains both mission mode and test mode circuitry. It should be appreciated that the order of the scan cells within a scan chain is not arbitrary. Rather, a certain order may be imposed on the scan cells by the scan insertion processes.

The scannable netlist 320 is then input to the scan chain partitioning process block 330 of the. present invention. A goal of process 330 is to identify sets of memory elements such that the order of the scan cells within that set does not matter. At one extreme, all scan memory elements can be included in a set within which the elements can be re-ordered in any fashion. This would be a typical solution where layout does not need to worry about test aspects of the design. At the other extreme, there are as many sets as there are memory elements in the design. That is, every memory element is in a different set for re-ordering. This set is the most restrictive from the layout perspective as no re-ordering can be done. One can view this example to be that the test requirements were so stringent that they dictated the ordering of the scan chain.

Particularly, the scan chain partitioning process block 330 partitions the scan chain based on clock domains, edge sensitivity types, skew tolerance levels, BIST (Built-In Self Test) cone logic feeding, and SSO (Simultaneous Switching Output) requirements of the scan cells. The result of the partitioning process 330 includes data representative of the sets of re-orderable scan cells 340. For simplicity, the data representative of the sets of re-orderable scan cells 340 is referred to as "partitioning information" 340.

Referring again to FIG. 3, the scannable netlist 320 and the partitioning information 340 are input into layout processes represented as a place-and-route process 350. The place-and-route process 350 first finds a coordinate location for each cell on a circuit board or silicon chip based on certain heuristics designed to minimize relationships impacting area, timing, etc. of the netlist circuit. The locations are selected to optimize certain objectives such as wire length, circuit speed, power consumption, and/or other criteria, and subject to the condition that the cells are routable, e.g., that the cells are spread evenly over the circuit board or silicon chip, and that the cells do not overlap with each other. Significantly, in accordance with the present invention, place-and-route process 350 is restricted from re-ordering scan cells among different sets of re-orderable cells. In other words, process 350 may only re-order the scan cells of the same set. The placement locations and wire geometry are optimized for the scan cells contained in the same set, and this is done for each set separately. The output of this placement and routing process 350 includes cell placement data structures and wire geometry data structures 355 of a properly ordered scan cells.

After the cell placement and wire geometry data structures 355 of the integrated circuit design are produced, other computer-aided design processes 360 continue until the integrated circuit design can be fabricated into an integrated circuit 365.

Figure 4A:
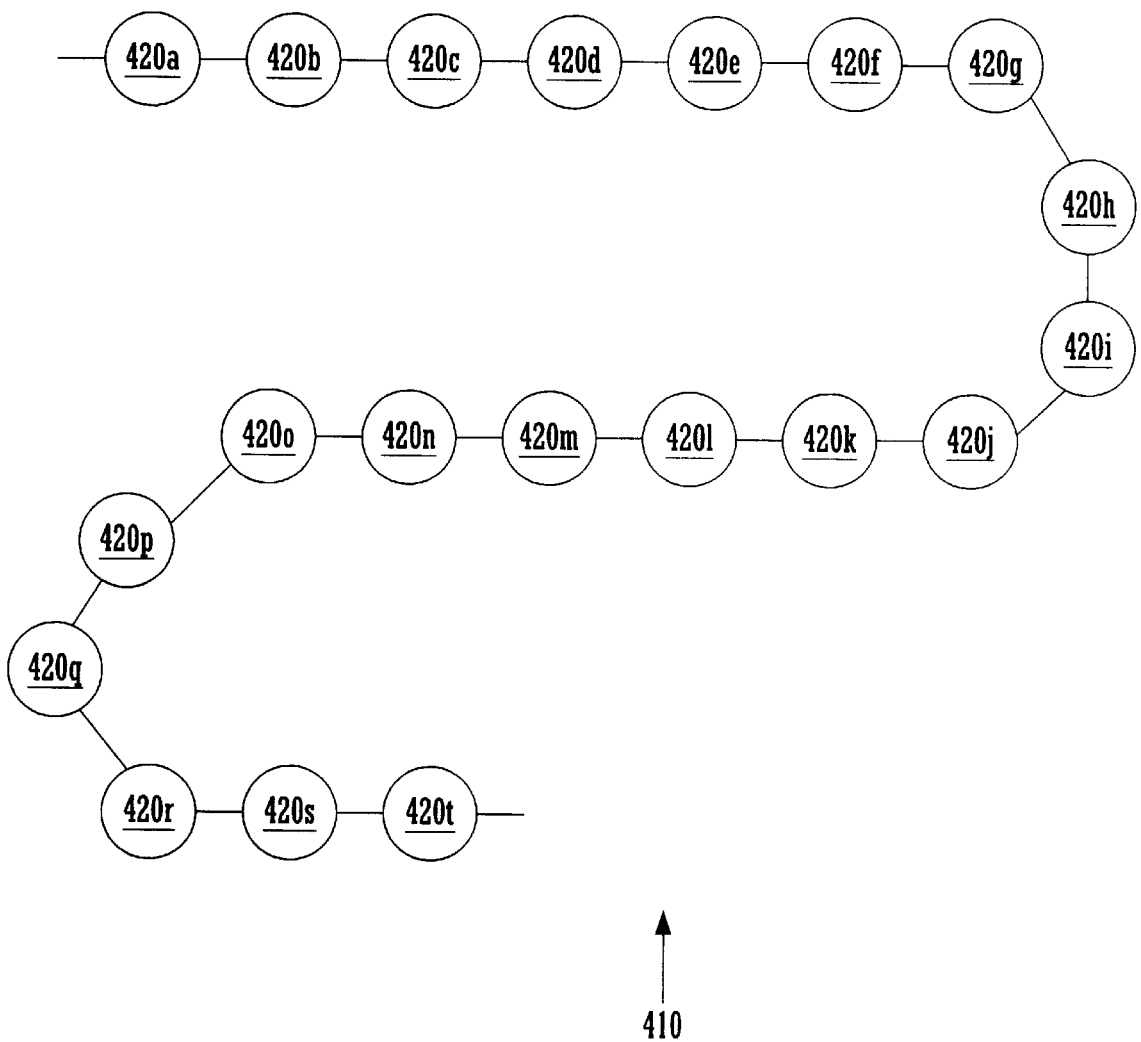
FIG. 4A is a logical block diagram of an exemplary scan chain on which the process according to the present invention can be applied.

FIG. 4A a logical block diagram illustrating an exemplary scan chain 410 before the scan chain partitioning process (e.g., process 330) according to the present invention is applied. As shown, scan chain 410 consists of twenty scan cells 420a–420t linked together to form a shift register configuration. For simplicity, the combinational logic surrounding the scan chain 410 is not illustrated.

Figure 4B:
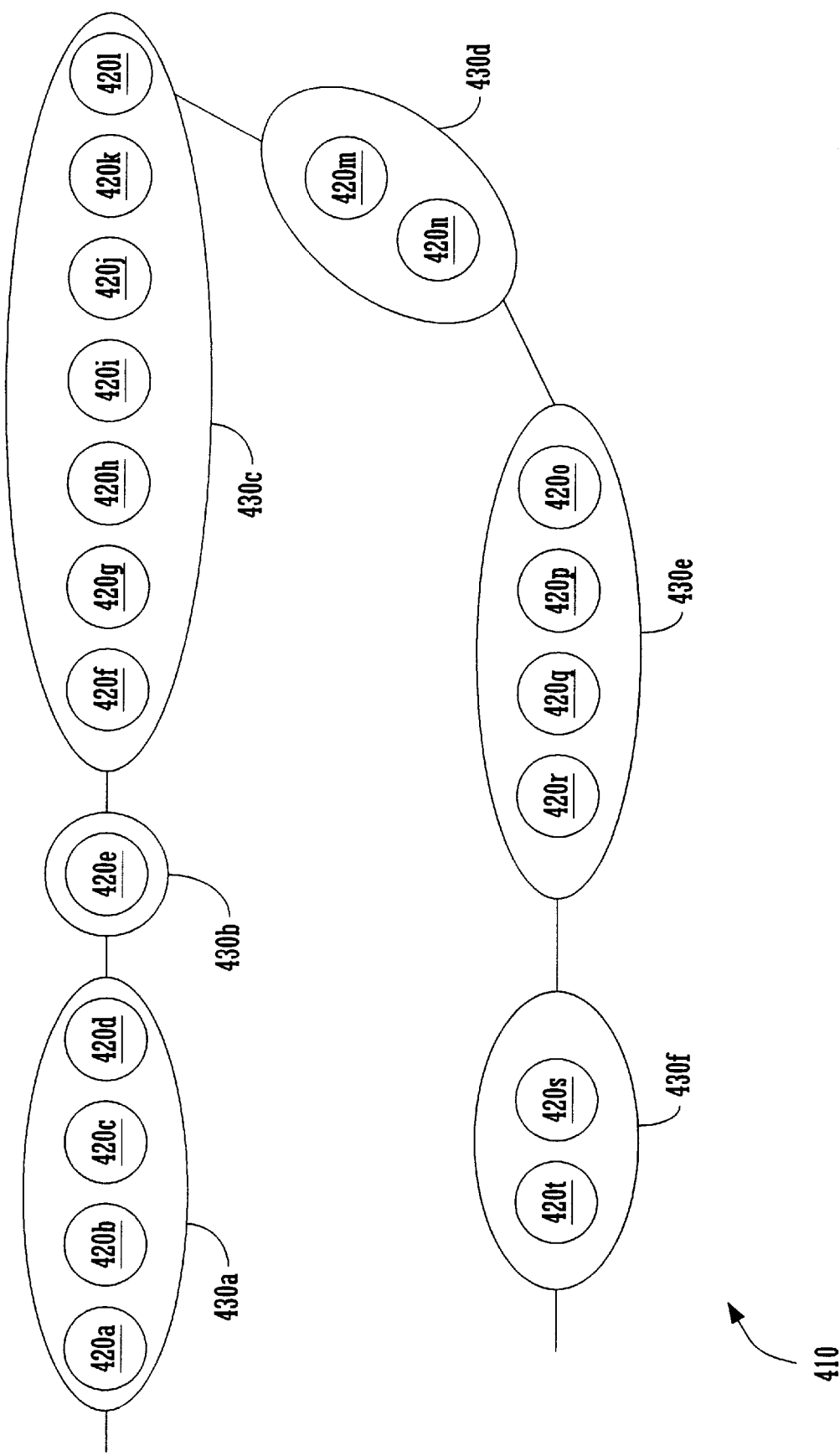
FIG. 4B is a logical block diagram of the exemplary scan chain shown in FIG. 4 after the partitioning process in accordance with the present invention.

FIG. 4B illustrates the scan chain 410 after the scan chain partitioning process according to the present invention is applied. As illustrated, scan chain 410 includes six sets of re-orderable scan cells. The first set 430a includes scan cells 420a–420d, the second set 430b includes scan cell 420e, the third set 430c includes scan cells 420f–420i, the fourth set 430d includes scan cells 420m–420n, the fifth set 430e includes scan cells 420o–420r, and the sixth set 430f includes scan cells 420s–420t. According to the present invention, the cells within each set 430a–430f are re-orderable among cells of the same set. Inter-set re-ordering, however, is not allowed. For example, the scan cells 420a–420d of the first set 430a may be re-ordered among themselves. Scan cells 420a–420d may not be re-ordered with scan cells 420q of the fifth set 430e.

Figure 5A:
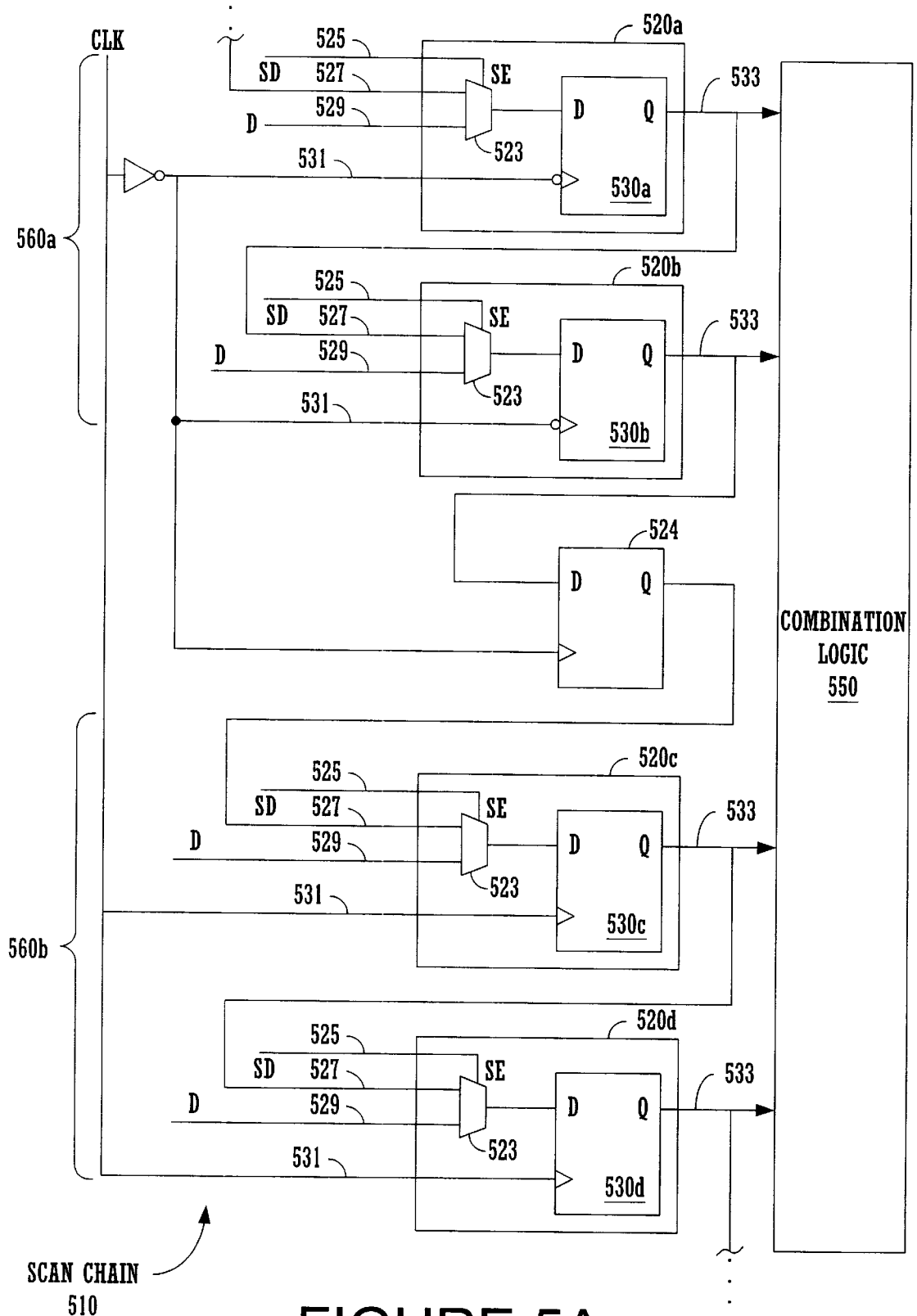
FIG. 5A is a logical block diagram of a segment of an exemplary scan chain on which the process according to the present invention can be applied.

FIG. 5A is a logical block diagram of an exemplary scan chain segment 510 on which the present invention can be applied. For simplicity, scan chain segment 510 is referred to herein as "scan chain" 510. As illustrated, the scan chain 510 includes scan cells 520a–520d and a lock-up latch 524 coupled between cells 520a–520b and cells 520c–520d. The scan cells 520a–520d in this example consist of multiplexed D input flip-flops which are linked together to form a shift register configuration.

In the illustrated example, the scan cells 520a–520d are analogous. Thus, for simplicity, only one cell 520a is described herein. The D input of the flip-flop 530a is coupled to the output of the multiplexer 523 which has a select line input 525, called the scan enable or SE line. The data inputs to the multiplexer 523 are a D input 529 and a SD shift input 527 which originates from a previous scannable memory cell, or from a primary input if the cell is the first cell in the scan chain 510. It is appreciated that the output of the mission mode logic or combination logic 550 is coupled to the D inputs 529 of the scan cells 520a–520d. Each of the cells 520a–520d also includes a CLK input line 531 for receiving a scan clock signal. The output 533 of cell 520a is routed to combination logic 550, and is also routed to the SD input 527 of another scannable memory cell 520b, or to a primary output, if the cell is the last cell of the scan chain 510. It is appreciated that Q or /Q output pin can be utilized in the chain configuration.

In the present exemplary scan chain 510, scan cells 520a–520b include positive-edge triggered flip-flops 530a–530b, and cells 520c–520d include negative-edge triggered flip-flips 530c–530d. The lock-up latch 524 is inserted in order to capture the output of cell 520b such that the output is available to the cell 520c at the negative edge of the next clock cycle. It would be advantageous to maintain the ordering of the negative-edge triggered scan cells 520a–520b and the positive-edge triggered scan cells 520c–520d in the physical design. The connection between cells 520a–520b and the connection between cells 520c–520d are less important.

Therefore, according to the present invention, scan chain 510 is partitioned into two sets 560a and 560b. Particularly, set 560a includes positive-edge triggered memory cells 520a–520b, and set 560b includes negative-edge triggered memory cells 520c–520d. Further, in the present embodiment, data representative of the sets 560a and 560b is stored in data structure 340 (FIG. 3) and is imposed on the layout processes 350 to prevent the re-ordering of scan cells among different sets. Layout processes 350, however, are allowed to freely rearrange the order of the cells 520a–520b of set 560a, and the order of the cells 520c–520d of set 560b.

Figure 5B:
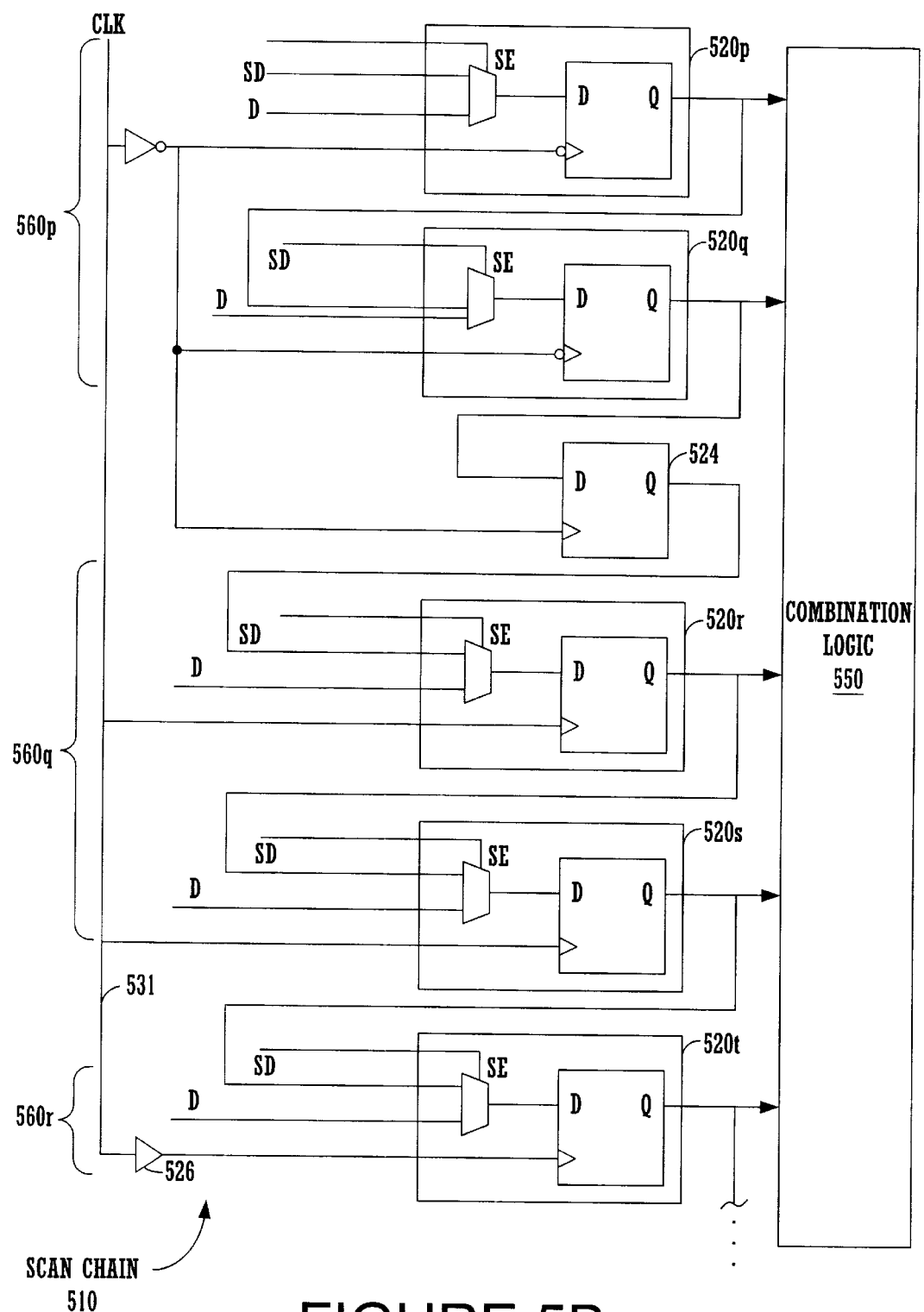
FIG. 5B is a logical block diagram of another segment of the exemplary. scan chain on which the process according to the present invention can be applied.

FIG. 5B is a logical block diagram illustrating another scan chain segment 515 on which the present invention can be applied. As illustrated, the scan chain segment 515 includes scan cells 520p–520t which consist of multiplexed D input flip-flops linked together to form a shift register configuration. Also illustrated is clock buffer 526 which is inserted on the clock signal line 531 between cells 520s and 520t.

In the particular embodiment as illustrated, scan chain set 515 may be partitioned into three sets of scan cells: a first set 560p consisting of scan cells 520p–520q, a second set 560q consisting of scan cells 520r–520s, and a third set 560r consisting of scan cell 520t. According to the present embodiment, re-ordering constraints are imposed on the layout processes (e.g., process 350) to restrict the re-ordering of scan cells among different sets. According to the present invention, layout tools are allowed to freely re-order of the cells within their respective sets. The layout tools, however, may not rearrange the order of scan cells among different sets. For instance, scan cells within the first set 560p may not be interchanged with cells within the second set 560q or the third set 560r.

It should be appreciated that the scan chain segments 510 and 515 of FIGS. 5A and 5B are described for illustration purposes only, and that scan chains may be partitioned according to other criteria. For example, a scan chain may be partitioned based on the clock domain associated with each cell. If the scan chain includes reconfigurable multiplexers, the scan chain may be partitioned based on the position of the reconfigurable multiplexers. The scan chain may also be partitioned based on surrounding cone logic feeding and SSO (Simultaneous Switching Outputs) requirements of the scan cells. These alternative techniques are described below.

Figure 6:
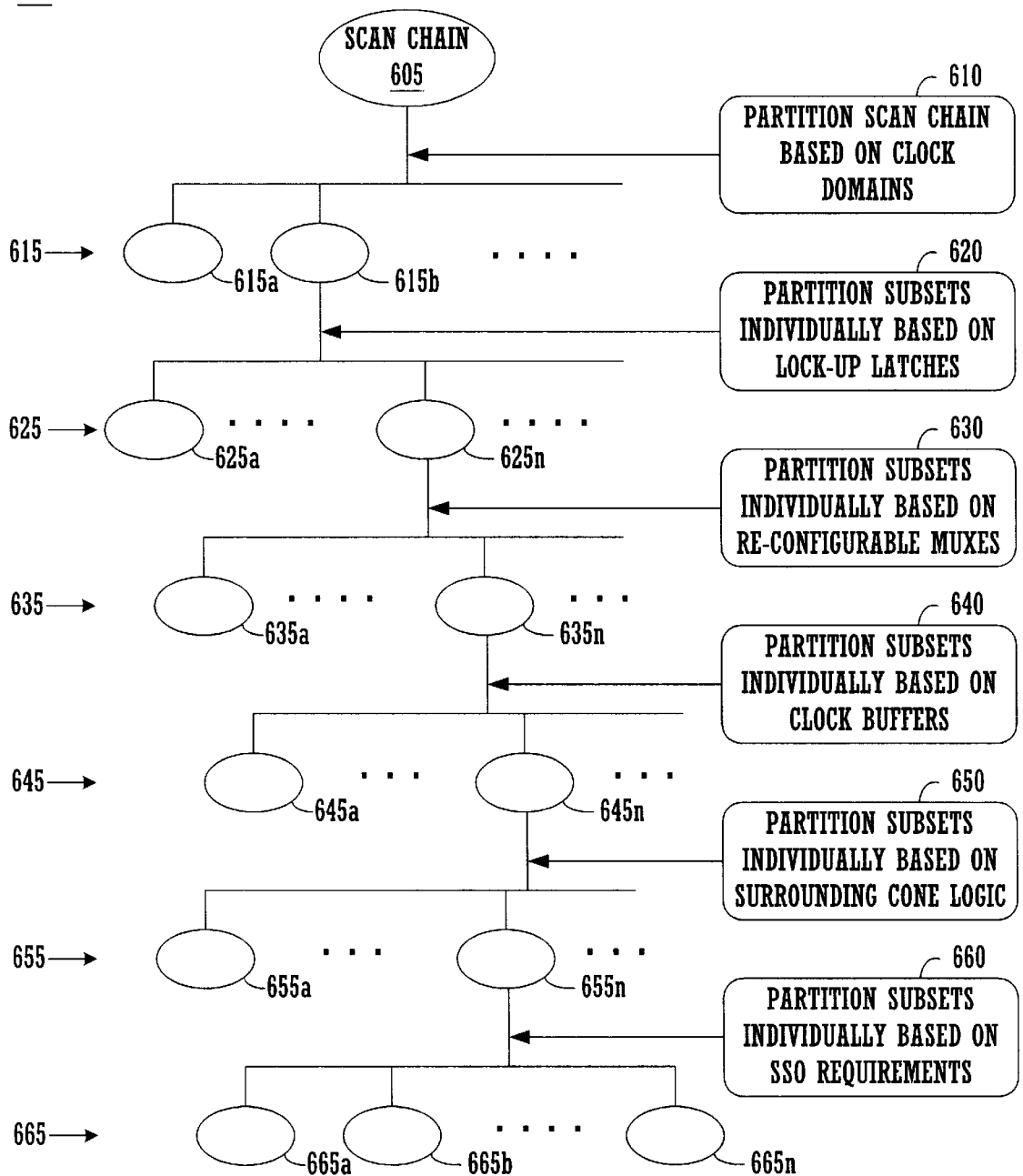
FIG. 6 is a flow chart diagram illustrating a process of partitioning a scan chain according the present invention.

FIG. 6 is a flow chart diagram illustrating steps of scan chain partitioning process 330 according to the present invention. Process 330 can be implemented as program code stored in computer readable memory units of system 201 and executed on processor 204. In the following description, an exemplary scan chain 605 is partitioned to illustrate the process of the present invention. For simplicity, it is assumed that the scan chain 605 is generated by synthesis and scan insertion processes (e.g., process 310), and that the scan cells are initially arranged in an order dictated by such processes. The initial order is typically based on the hierarchical order of the netlist and/or based on clock constraints.

As illustrated in FIG. 6, at step 610, the scan chain 605 is partitioned into subsets 615 (including subsets 615a–615b) based on clock domain information. In the present embodiment, scan cells of each subset share a common clock domain. For instance, scan cells subset 615a may share a first clock domain, and scan cells of subset 615b may share a second clock domain. For simplicity, only two subsets are illustrated for each partitioning step. However, it should be appreciated that the number of subsets formed by each partitioning step is arbitrary.

The present invention recognizes that scan cells should be configured such that mixing of edges is minimized. To that end, synthesis and scan-insertion processes (e.g., process 310) may group scan cells of the same edge sensitivity type together, and may insert lock-up latches between different groups of scan cells having the same edge-sensitivity type. Therefore, routing should maintain the position of lock-up latches which are not typically visible by the layout process 350. According to the present invention, in order to forward such ordering information to layout processes, subsets 615 are individually partitioned based on the respective edge sensitivity types of the scan cells at step 620. Partitioning can be based on the positions of lock-up latches with respect to scan cells of the pertinent subset. As illustrated, smaller subsets 625 (including subsets 625a–625b), which are separated by lock-up latches, are formed as a result of the partitioning of one subset 615. It should be understood that all subsets 615 are similarly partitioned by step 620. However, only the ramification of partitioning one subset 615b is illustrated for simplicity.

Typically, multiplexers are used to reconfigure scan chains in different modes of operation. These reconfigurable multiplexers are, therefore, boundaries of different segments of the scan chain. In a BIST (Built-In Self Test) environment, the size of each segment should be maintained. Therefore, if the scan chain 605 includes reconfigurable multiplexers, it would be desirable to ensure that the layout process 350 maintains the connections of the reconfigurable multiplexers. Accordingly, at step 630, subsets 625 are individually partitioned according to the positions of re-configurable multiplexers with respect to scan cells of the pertinent subset. Also illustrated in FIG. 6 is one subset 625n that is partitioned into smaller subsets 635.

It is appreciated that, within the present invention, not all clocks have the same importance. For instance, in Level Sensitive Scan Designs (LSSD), the system clock is more important than the B clock, which is in turn more important than the A clock. Therefore, in dealing with clock skew tolerance, step 640 may take the hierarchical relationship of the skew tolerance of the clocks into consideration when partitioning. According to the present invention, at step 640, subsets 635 are individually partitioned based on the skew tolerance levels of the scan cells. As illustrated, one subset 635n is partitioned into smaller subsets 645. Partitioning can be based on the positions of the clock buffers with respect to the scan cells of the pertinent set.

In a BIST (Built-In Self Test) environment, it is a desirable goal to avoid dependencies in values scanned into the scan chains that are fed by the same LFSR (Linear Feedback Shift Register). These dependencies are ignorable if scan chains feed independent logic. Therefore, it is desirable to partition the scan chains based on surrounding cone logic feeding. According to the present invention, at step 650, subsets 645 are individually partitioned based on the surrounding cone logic feeding associated with the scan cells of the pertinent set. As illustrated, step 650 partitions one subset 645*n* to form smaller subsets 655.

It is also desirable to place simultaneously switching cells on different power rails because the maximum amount of switching that happens in a design is typically during scan. Such requirements could limit the size of the partitions identified for re-ordering. Accordingly, at step 660, subsets 655 are individually partitioned according to simultaneously switching output (SSO) requirements of scan cells of the pertinent set. As illustrated, one subset 655*b* is partitioned into final sets 665*a*–665*n* at step 660. Data representative of the final sets 665*a*–665*n* is then provided to layout process 350 as partitioning information of the scan chain 605.

In furtherance of the present invention, the final sets 655 each contains scan cells that share the same clock domain, edge sensitivity type and skew tolerance level. In addition, the scan cells of each final set 655 are associated with the same reconfigurable multiplexers and the same surrounding cone logic. Furthermore, scan cells of each final set 655 meet the same SSO requirements. Accordingly, layout tools may freely re-order scan cells within each final set without violating the ordering limitations that are embodied within the initial order of the scan chain 605.

below illustrates some exemplary variations of the partitioning order in further of the present invention. Serial

TABLE 1

| Variation 1 | Variation 2 | Variation 3 | Variation 4 | Variation 5 |
|---|---|---|---|---|
| Step 610 | Step 620 | Step 610 | Step 620 | Step 660 |
| Step 630 | Step 630 | Step 620 | Step 630 | Step 650 |
| Step 640 | Step 640 | Step 640 | Step 640 | Step 640 |
| Step 620 | Step 650 | Step 650 | Step 660 | Step 630 |
| Step 660 | Step 660 | | | Step 620 |
| Step 650 | Step 610 | | | Step 610 |

Furthermore, according to the present invention, partitioning criteria (e.g., skew tolerance levels, edge sensitivity types, etc.) are applied to a scan chain to generate partitioning information specific to a scan chain, which is, in turn, provided to the layout processes as re-ordering limitations. Therefore, it should be appreciated that, other partitioning criteria within the spirit of the present invention, although not specifically mentioned, may also be applied.

It should also be appreciated that the present invention can implemented in a computer-aided design (CAD) system in any common computer languages such as C or C++. An exemplary computer implemented process for partitioning a scan chain is illustrated below in Table 2 in pseudocode.

TABLE 2

```
BEGIN SCAN CHAIN ORDER:
Create_basic_scan_chains_based_upon_clocking ( )
// To begin with the memory elements are ordered by clock domain into
// different scan chains. If the chain has to be ordered such that rising
// edge FFs need to be feeding trailing edge FFs lock-up latches are
// added.
List_of_re-orderable_sets = null;
For_Each_Scan_Chain_grow_the_re-orderable_sets) i = 0; i < Num_scan_chains; I ++ ) {
    more_ffs_to_consider = scan_chain_ffs_as_partitioned_by_lockup_latches (i);
    while (more_ffs_to_consider ! = null) {
        set = null;
        reset_to_not_visited (design);
        while ( ( sizeof (set) < MAX) && (more-ffs-to-consider) ) {
            for (j = 0; j < more_ffs_to_consider; j++) {
                count_primitives_not_visited_in_cone_fed_by_ff (i);
            } end for loop over remaining ffs of scan chain.
            if (set == null ) {
                ffselected = select_FF_that_feeds_largest_number_of_not_visited_primitives ( );
            }
            else {
                ffselected = select_FF_that_feeds_maximum_number_of_visited_primitives ( );
            }
            set = set + ffselected;
            mark_forward_cone_of_ff_as_visited ( ffselected);
            more_ffs_to_consider = more_ffs_to_consider − ffselected;
        } end while loop to create a set.
        List_of_re-orderable_sets = List_of_re-orderable_sets + set;
    } end while loop over creating sets over ffs of a single scan chain.
} end for loop over scan chains.
```

It should be appreciated that the order in which steps 610, 620, 630, 640, 650, and 660 of FIG. 6 are performed is immaterial. Rather, the aforementioned steps may be performed in an arbitrary order. For instance, scan chain partitioning step 660 based on SSO requirements may be performed prior to partitioning step 650. Furthermore, one or more of steps 610, 620, 630, 640, 650, and 660 may be omitted. Any permutations, combinations or variations of the above order should be construed to be different embodiments within the scope of the present invention. Table 1

The example in Table 2 starts from the most restrictive solution to create sets as large as possible under the constraints where the test issues are taken care of. However, there will be restrictions on the maximum size of the sets identified based upon balancing requirements of BIST and simultaneous switching concerns during scan.

The process grows the sets from the available list of scan cells in a scan chain, Once the sets are created, layout can reorder memory elements within the set. The final scan chains are composed of these sets of memory elements separated by buffers, MUXes, or lock-up latches.

IV. PLACEMENT-BASED SCAN-IN AND SCAN-OUT PORTS SELECTION IN ACCORDANCE WITH THE PRESENT INVENTION

In order to conserve chip device pins, designers sometimes use functional pins for scan-in and scan-out ports of the scan chain. Typically, functional pins are assigned as scan-in and scan-out ports by a DFT (Design For Test) tool during the scan insertion process (e.g., process 120) based on schematic information. This approach, however, is not ideal because the designations of particular functional pins as being scan-in and scan-out ports may restrict the layout processes from placing scan cells in the best possible positions. In addition, if inappropriate scan-in and scan-out ports are selected before cell placement, scan cells may be placed in positions that require an excessive amount of routing resources for connecting the scan cells to the scan-in and scan-out ports. As a result, place-and-route processes may be hindered from fully optimizing the layout of the integrated circuit design.

Figure 1:
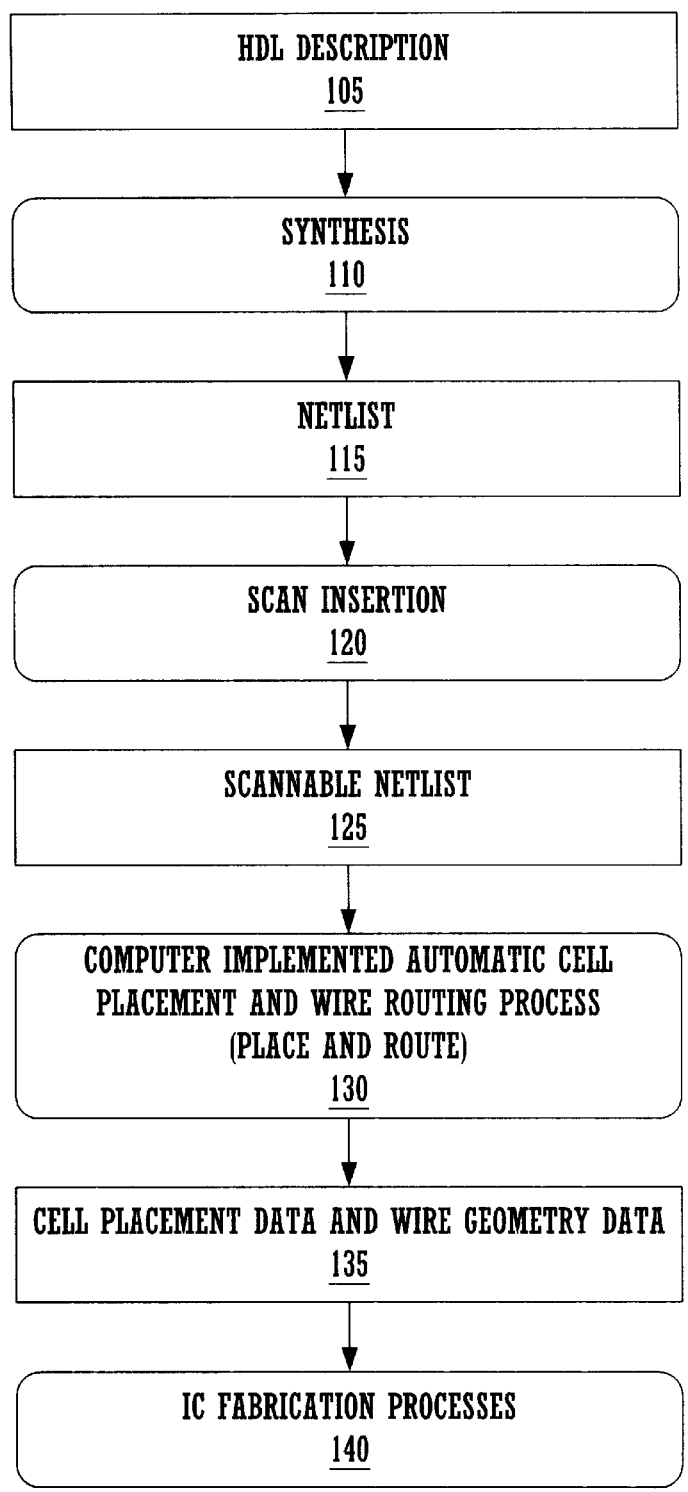
FIG. 1 is an exemplary flow chart diagram of a conventional logic synthesis process.
Figure 7:
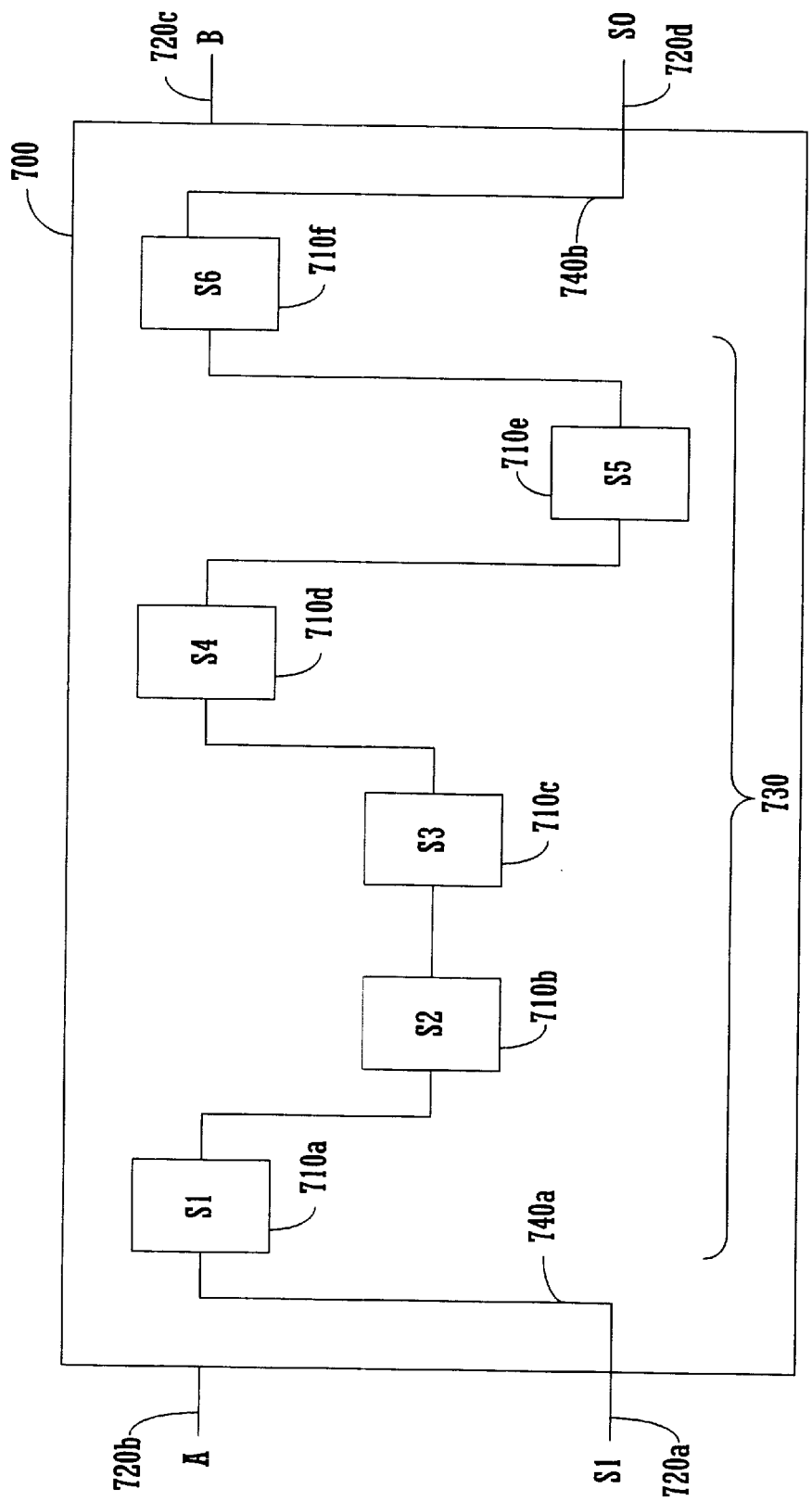
FIG. 7 illustrates an exemplary integrated circuit layout generated according to a conventional automatic cell placement and wire routing process.

FIG. 7 illustrates an exemplary integrated circuit layout 700 generated according to an automatic cell placement and wire routing process such as process 130 (FIG. 1). Layout 700 includes a plurality of scan cells 710a–710f that are serially linked together to form a scan chain 730. The leading scan cell 710a is connected by wire 740a to an external pin 720a that is designated as the scan-in ("SI") port; and, the last scan cell 710f is connected by wire 740b to an external pin 720d that is designated as the scan-out ("SO") port. The layout 700 also includes pins 720b–720c that are used to input and output functional signals.

Due to the constraints designating pins 720a and 720d as scan-in and scan-out ports, respectively, scan cells 710a–710f may not be placed by automatic placement processes in the best possible positions. For instance, as illustrated in FIG. 7, using pins 720a and 720d as scan-in and scan-out may not be wirelength efficient for the scan chain 730. More than a minimum amount of routing wire may be required to connect the scan cells 710a and 710f to pin 720a and pin 720d. More wire is required to connect S1 to S2 and to connect S5 to S6. This may result in higher routing congestion and violations of design criteria such as circuit timing.

Accordingly, the present invention provides for an automatic scan-in and scan-out port selection process that optimizes cell placement and wire routing by selecting the scan-in and scan-out ports. In accordance with one embodiment of the present invention, cell placement and routing processes are performed without regard to any previously designated scan-in and scan-out port assignments. Rather, scan-in and scan-out ports are subsequently selected from among the functional pins based on final placement information. In this manner, wire lengths and routing congestion are minimized with respect to the resultant scan chain.

Figure 9:
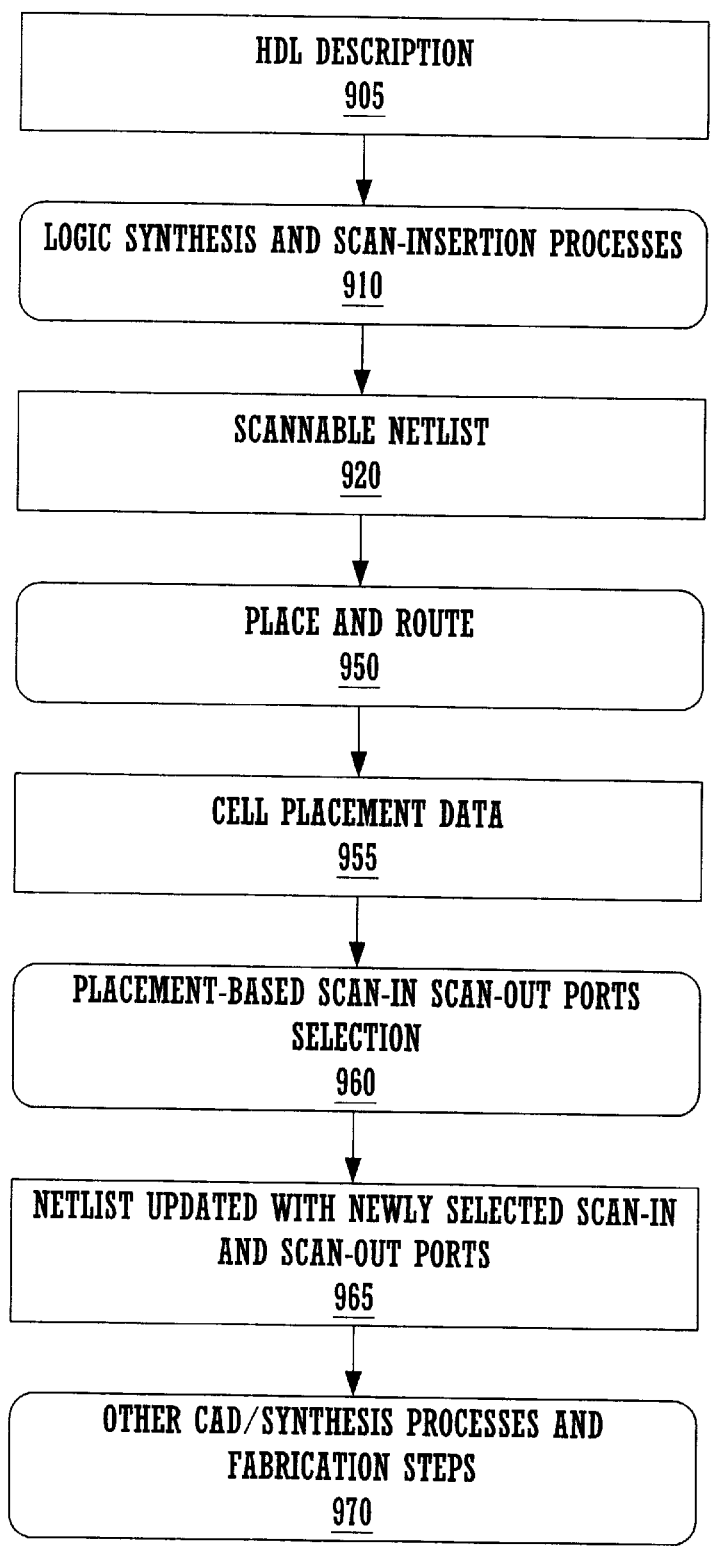
FIG. 9 is a flow chart diagram illustrating a test mode circuitry place-and-route process in accordance with one embodiment of the present invention

FIG. 9 is a flow chart diagram illustrating an electronic design automation (EDA) process 900 in accordance with the automatic scan-in and scan-out port selection process of the present invention. The steps of process 900 are implemented within the computer controlled CAD system described above in the form of computer readable codes. As shown, an HDL description 905 of an integrated circuit design is input into a synthesis and scan-insertion step 910. Synthesis processes of step 910 may include well known procedures such as HDL compiling procedures, logic optimization procedures,.and mapping procedures.

Step 910 further includes scan-insertion processes for inserting scan cells into the overall integrated circuit design. Scan-insertion processes of step 910 also link groups of scan cells into respective scan chains. The output of the scan insertion processes is a scannable netlist 920 that contains both mission mode and test mode circuitry. 10.

The scannable netlist 920 is then passed to layout processes represented as a place-and-route process 950. The place-and-route process 950 first finds a coordinate location for each cell on a circuit board or silicon chip based on certain heuristics designed to minimize relationships impacting area, timing, etc. of the netlist circuit. The locations are selected to optimize certain objectives such as wire length, circuit speed, power consumption, and/or other criteria, and subject to the condition that the cells are routable, e.g., that the cells are spread evenly over the circuit board or silicon chip, and that the cells do not overlap with each other. Significantly, in accordance with the present invention, place-and-route process 950 is performed without regard to any constraints that designate any functional pins as a scan-in port or a scan-out port. When such constraints are removed or disregarded, placement and routability of the integrated circuit design is significantly improved.

In accordance with one embodiment of the present invention, place-and-route process 950 may re-order the scan-chain based on placement. This placement-based scan-chain re-ordering process may also be performed without regard to any constraints that designate any functional pins as the scan-in port or a scan-out port. In this way, the re-ordering process is also optimized when the scan-in and scan-out ports are not fixed, resulting in better placed and better routed designs.

With reference still to FIG. 9, cell placement data structures 955 generated by the place-and-route process 950 are passed to a placement-based scan-in and scan-out ports selection process 960 of the present invention. The process 960 selects functional pins for scan-in and scan-out based on the placed positions of the scan cells such that routing wire lengths and routing congestion are minimized. In one particular embodiment of the present invention, the process 960 determines the functional pins that are closest to the leading scan cell and to the last scan cell of the scan chain, and designates them as the scan-in and scan-out ports, respectively.

In addition to identifying suitable functional pins for scan-in and scan-out ports, process 960 modifies the netlist 920 and generates an updated netlist 965 that includes the newly selected scan-in and scan-out pins. In one embodiment of the present invention, multiplexer (mux) gates are used to convert existing functional input and output pins into dual-function scan-in and scan-out ports.

According to the present invention, updated netlist 965 is then passed to other CAD/Synthesis processes 970. In one embodiment of the present invention, CAD/Synthesis processes 970 may include ATPG (Automatic Test Pattern Generation) processes and various simulation and verification processes. ATPG, simulation, verification, etc., are well known processes in the art and are therefore not described herein in order to avoid obscuring aspects of the present invention.

Figure 8A:
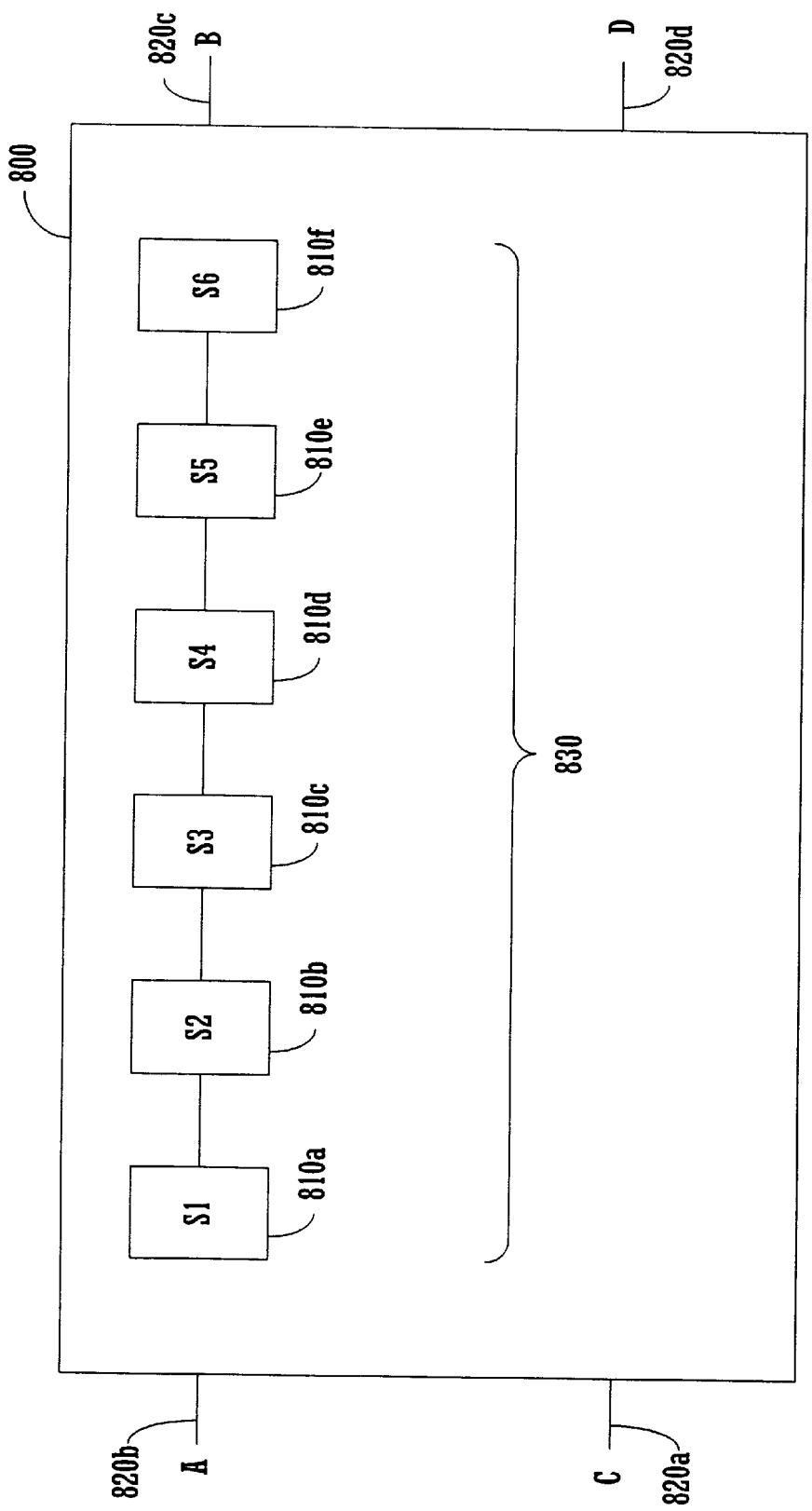
FIG. 8A illustrates an exemplary layout generated according to an automatic cell placement and wire routing process according to one embodiment of the present invention.

FIG. 8A illustrates an exemplary layout 800 generated according to an automatic cell placement and wire routing process (e.g., process 950) according to one embodiment of the present invention. As shown, layout 800 includes an exemplary placement of a plurality of scan cells 810a–810f that are serially linked together to form a scan chain 830.

Layout 800 further includes functional pins 820a–820d which are configured for receiving and outputting functional signals and data for mission mode circuitry (not shown). According to the present invention, because any constraints designating the scan-in and scan-out ports for the scan chain 830 are disregarded, scan cells 810a–810f are placed in the best possible positions for wirelength and timing optimization. It should be noted that, after the cell placement and wire routing process, the scan-in and scan-out ports are not yet selected. Thus, the scan-chain 830 is not connected to any particular input or output pins 820a–820d.

Figure 8B:
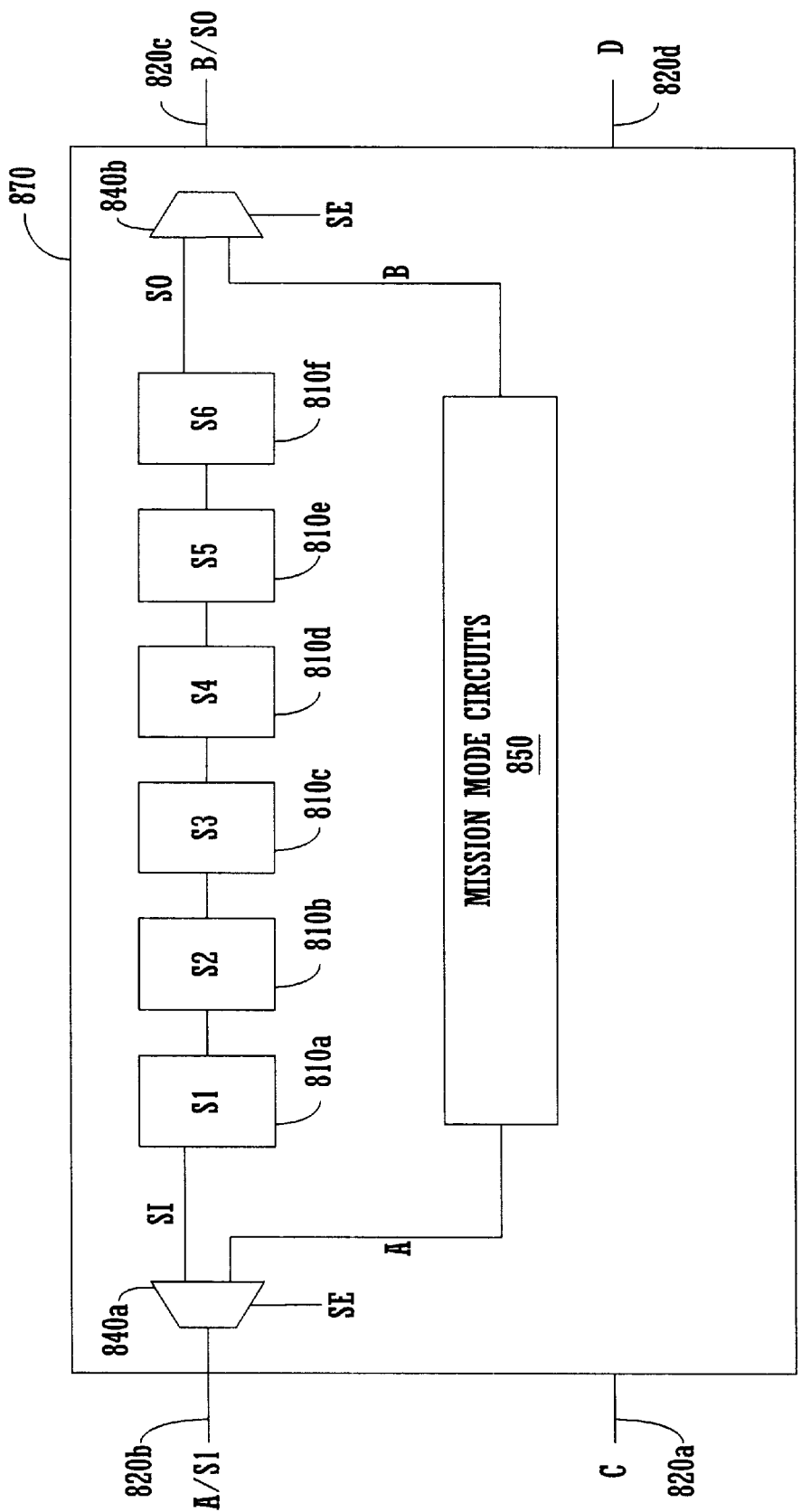
FIG. 8B illustrates the exemplary layout of FIG. 8A modified according to a placement-based scan-in and scan-out port selection process in furtherance of one embodiment of the present invention.

FIG. 8B illustrates the exemplary layout 870 generated by modifying the layout 800 of FIG. 8A according to a placement-based scan-in and scan-out ports selection process (e.g., process 960) in accordance with the present invention. Particularly, the port selection process 960 of the present invention determines the scan-in and scan-out ports based on the final placement positions of the leading scan cell 810a and the last scan cell 810f of the scan chain 830. As illustrated in FIG. 8B, the leading scan cell 810a is closest to functional pin 820b, and the last scan cell 810d is closest to the functional pin 820c. Therefore, functional pin 820b is selected by process 960 to be the scan-in port, and functional pin 820c is selected by process 960 to be the scan-out port. Thus, the present invention reduces the length of the routing wires required for connecting scan-in and scan-out ports to the scan chain and also between the cells of the scan cells.

In the present embodiment, multiplexer gates 840a–840b are inserted to add scan-in and scan-out functionalities to the functional pin 820b and 820c, respectively. As illustrated, by using multiplexers 840a–840b functional pins 820b and 820c can be used to for scanning during test mode (e.g., when signal SE is asserted). During mission mode (e.g., when signal SE is unasserted), multiplexers 840a–840b connects functional pins 820a–820c to mission mode circuitry 850. However, it should be appreciated that other circuits well known in the art may also be used for adding scan-in and scan-out functionalities to the functional pins 820b–820c.

Figure 10:
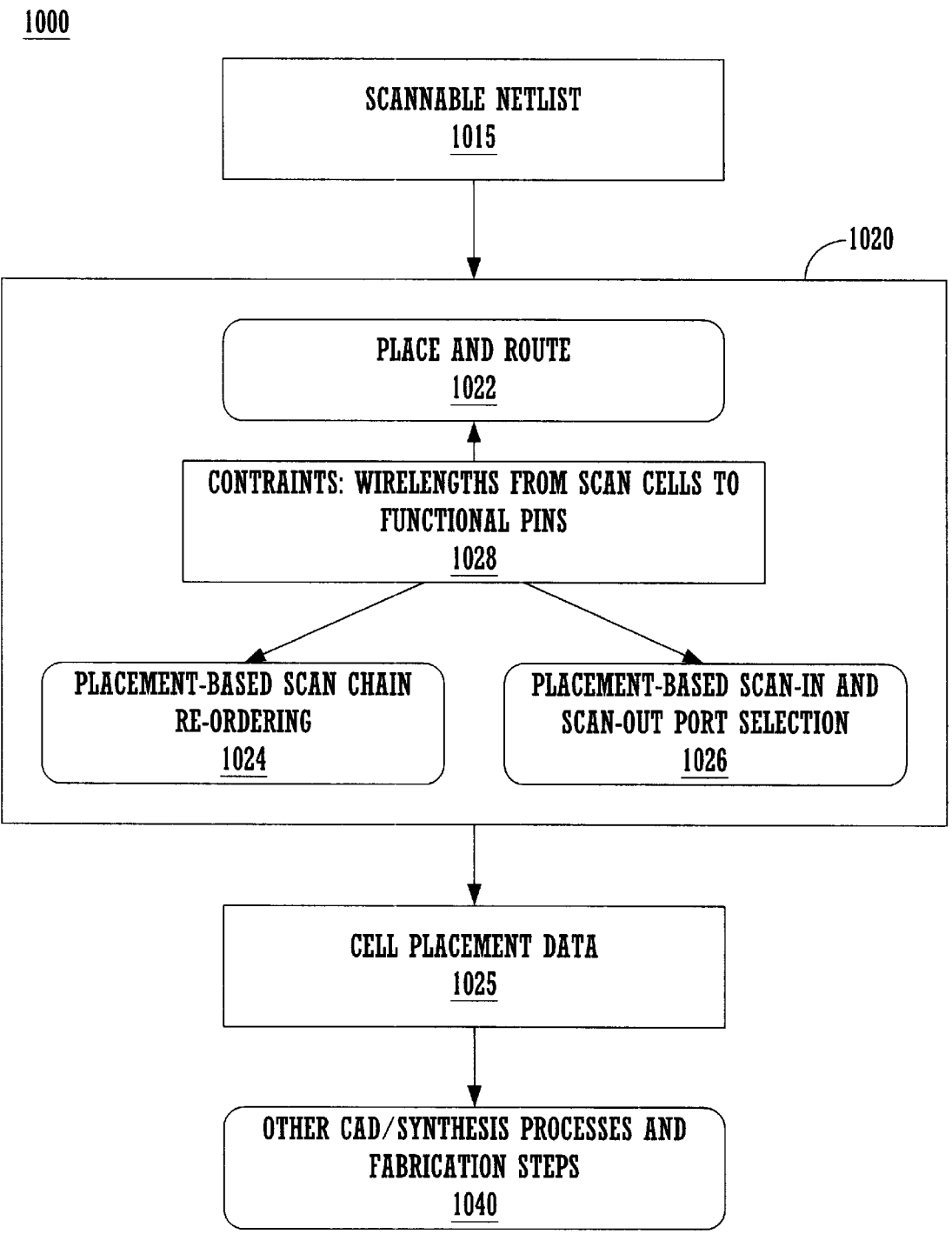
FIG. 10 is a flow chart diagram illustrating a test mode circuitry place-and-route process 1000 in accordance with another embodiment of the present invention.

FIG. 10 is a flow chart diagram illustrating steps of an EDA process 1000 in accordance with another embodiment of the present invention. Particularly, process 1000 includes a place-and-route step 1022, a placement-based scan-chain re-ordering step 1024. According to the present embodiment of the invention, place-and-route step 1022 and scan-chain re-ordering step 1024 are performed without regard to any constraints designating any functional pins as scan-in and scan-out ports. However, constraints 1028 including wire lengths from the scan cells to the functional pins are used by steps 1022 and 1024 to determine the best possible placement for the cells. The result of the steps 1022 and 1024 is a modified netlist 1025.

Thereafter, a placement-based scan-in and scan-out port selection step 1026 is applied to modified netlist 1025. According to the present embodiment, step 1026 selects the functional pins that are closest to the leading scan cell and the last scan cell of the scan chain as the scan-in port and scan-out port, respectively. In addition, scan-in and scan-out functionalities are added to the selected functional pins at step 1026 to generate an updated netlist. Step 1026 may also generate cell placement data structures. The cell placement data structures and the updated netlist are then passed on to other CAD/synthesis processes and fabrication processes 1040.

Figure 11:
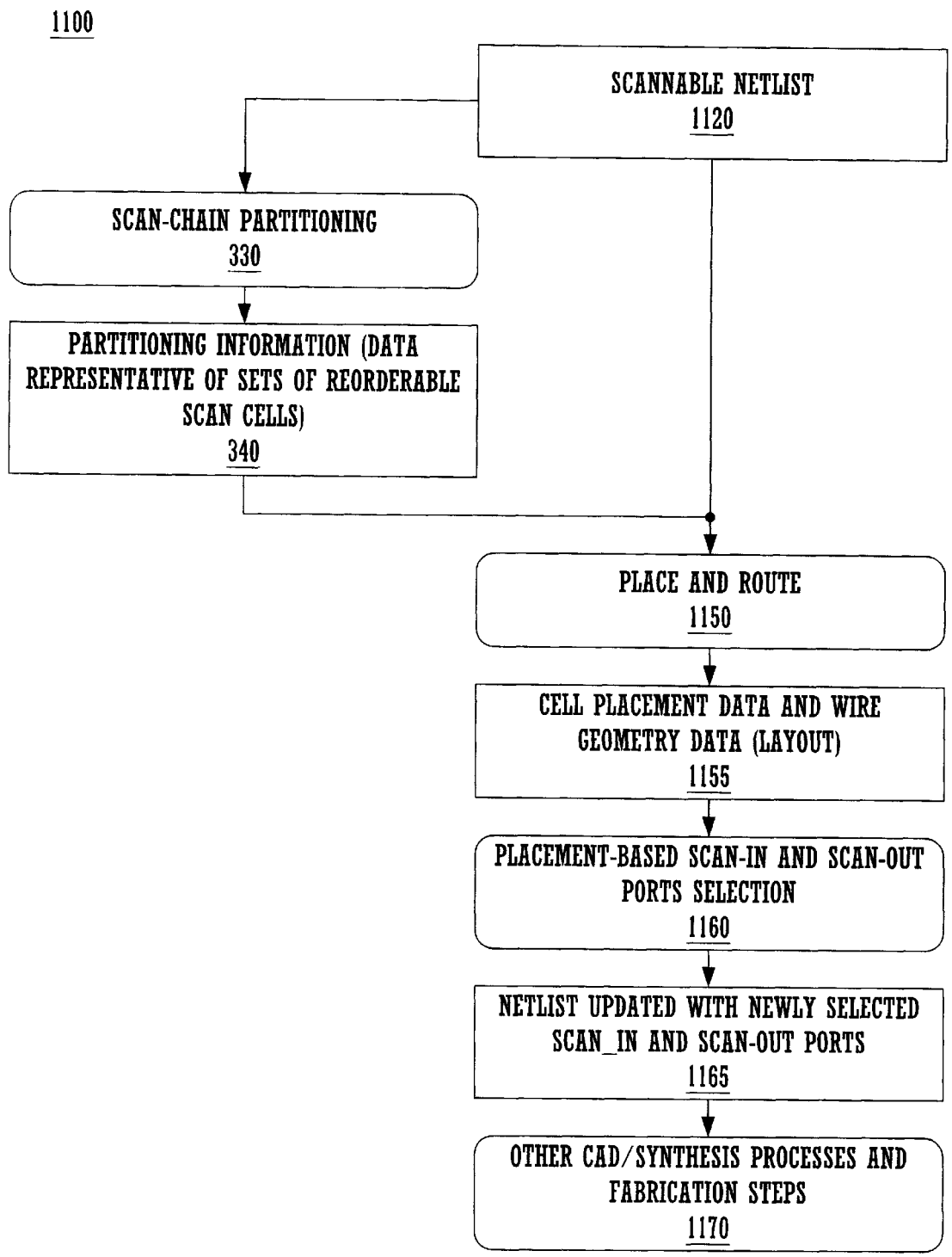
FIG. 11 is a flow chart diagram illustrating a test mode circuitry place-and-route process 1100 in accordance with yet another embodiment of the present invention.

FIG. 11 is a flow chart diagram illustrating an EDA process 1100 in accordance with yet another embodiment of the present invention. In the present embodiment, a netlist 1120 of an integrated circuit design containing a scan chain is input to the scan chain partitioning process step 330. Particularly, the scan chain partitioning process step 330 partitions the scan chain based on clock domains, edge sensitivity types, skew tolerance levels, BIST (Built-In Self Test) cone logic feeding, and SSO (Simultaneous Switching Output) requirements of the scan cells. The result of the partitioning process 330 includes data representative of the sets of re-orderable scan cells or "partitioning information" 340.

Referring still to FIG. 11, the scannable netlist 1120 and the partitioning information 340 are input into layout processes represented as a place-and-route process step 1150. The place-and-route process 1150 first finds a coordinate location for each cell on a circuit board or silicon chip based on certain heuristics designed to minimize relationships impacting wirelength, area, timing, etc. of the netlist circuit. In accordance with the present embodiment, place-and-route process 1150 is restricted from re-ordering scan cells among different sets of re-orderable cells. In addition, place-and-route process 1150 is performed without regard to any constraints that designate any functional pins as the scan-in and scan-out ports.

Cell placement data. structures 1155 generated by the place-and-routes. process 1150 are then passed to a. placement-based scan-in and scan-out ports selection process 1160. The process 1160 automatically selects functional pins for the scan-in and scan-out ports of the scan chain such that routing wire lengths and routing congestion are minimized. The process 1160 modifies the netlist 1120 and generates an updated netlist 1165 that includes the newly selected scan-in and scan-out port and the required multiplexing circuitry. Thereafter, other CAD/Synthesis and fabrication processes 1170 are performed until the integrated circuit is fabricated.

The present invention, a computer implemented process and system for selecting scan-in and scan-out ports for a scan chain of an integrated circuit design, has thus been described. By selecting scan-in and scan-out based on placement information, routing wire lengths and routing congestion can be significantly reduced. It should be appreciated that the present invention may be implemented as a stand-alone software process for use in conjunction with conventional place-and-route tools, or may be implemented as a portion of a layout tool. While the present invention has been described in particular embodiments, it should also be appreciated that the present invention should not be construed as limited by such embodiments, but should be construed according to the below claims.

What is claimed is:

1. In an electronic design automation system, a computer implemented method of constructing a scan chain, said method comprising the steps of:
   a) receiving a netlist description of an integrated circuit design having a plurality of functional pins;
   b) inserting scan cells to said netlist description, said scan cells being coupled serially together to form a scan chain;
   c) placing said scan cells to determine a cell layout, wherein said step (c) is performed without regard to any predetermined constraint designating a functional pin as a scan-in port and without regard to any predetermined constraint designating a functional pin as a scan-out port of said scan chain;
   d) based on said cell layout of said step (c), selecting a first functional pin of said plurality of functional pins to be a scan-in port of said scan chain; and e) modifying said netlist description to couple said first functional pin to a leading scan cell of said scan chain.

2. The method as recited in claim 1 wherein said first functional pin is selected according to a position of said leading scan cell of said scan chain relative to said plurality of functional pins.

3. The method as recited in claim 1 wherein said step (d) further comprises the steps of:
   d1) determining a functional pin of said plurality of functional pins that is closest to said leading scan cell; and
   d2) selecting said first functional pin to be said functional pin determined at step (d1).

4. The method as recited in claim 1 wherein said step (e) further comprises the steps of:
   e1) inserting a multiplexer within said netlist description; and
   e2) coupling said first functional pin to said leading scan cell via said multiplexer.

5. The method as recited in claim 1 further comprising the steps of:
   f) based on said cell layout of said step (c), selecting a second functional pin of said plurality of functional pins to be a scan-out port of said scan chain; and
   g) modifying said netlist description to couple said second functional pin to a last scan cell of said scan chain.

6. The method as recited in claim 5 wherein said second functional pin is selected according to a position of said last scan cell of said scan chain relative to said plurality of functional pins.

7. The method as recited in claim 5 wherein said step (f) further comprises the steps of:
   f1) determining a functional pin of said plurality of functional pins that is closest to said last scan cell; and
   f2) selecting said second functional pin to be said functional pin determined at step (f1).

8. The method as recited in claim 5 wherein said step (e) further comprises the steps of:
   e1) inserting a multiplexer within said netlist description; and
   e2) coupling said second functional pin to said last scan cell via said multiplexer.

9. In an electronic design automation system, a computer implemented method of constructing a scan chain, said method comprising the steps of:
   a) receiving a netlist description of an integrated circuit design having a plurality of functional pins;
   b) inserting scan cells to said netlist description, said scan cells being coupled serially together to form a scan chain;
   c) placing said scan cells to determine a cell layout for said integrated circuit design, wherein said step (c) further comprises the step of re-ordering said scan cells of said scan chain to form a re-ordered scan chain, wherein said step (c) is performed without regard to any predetermined constraint designating a functional pin as a scan-in port of said re-ordered scan chain;
   d) based on said cell layout of said step (c), selecting a first functional pin of said plurality of functional pins to be a scan-in port of said re-ordered scan chain; and
   e) modifying said netlist description to couple said first functional pin to a leading scan cell of said re-ordered scan chain.

10. The method as recited in claim 9 wherein said first functional pin is selected according to a position of said leading scan cell of said re-ordered scan chain relative to said plurality of functional pins.

11. The method as recited in claim 9 wherein said step (d) further comprises the steps of:
    d1) determining a functional pin of said plurality of functional pins that is closest to said leading scan cell; and
    d2) selecting said first functional pin to be said functional pin determined at step (d1).

12. The method as recited in claim 9 wherein said step (e) further comprises the steps of:
    e1) inserting a multiplexer within said netlist description; and
    e2) coupling said first functional pin to said leading scan cell via said multiplexer.

13. The method as recited in claim 9 wherein said step (c) is performed without regard to any predetermined constraint designating a functional pin as a scan-out port of said re-ordered scan chain.

14. The method as recited in claim 13 further comprising the steps of:
    f) based on said cell layout of said step (c), selecting a second functional pin of said plurality of functional pins to be a scan-out port of said re-ordered scan chain; and
    g) modifying said netlist description to couple said second functional pin to a last scan cell of said re-ordered scan chain.

15. The method as recited in claim 14 wherein said second functional pin is selected according to a position of said last scan cell of said re-ordered scan chain relative to said plurality of functional pins.

16. The method as recited in claim 14 wherein said step (f) further comprises the steps of:
    f1) determining a functional pin of said plurality of functional pins that is closest to said last scan cell; and
    f2) selecting said second functional pin to be said functional pin determined at step (f1).

17. The method as recited in claim 14 wherein said step (e) further comprises the steps of:
    e1) inserting a multiplexer within said netlist description; and
    e2) coupling said second functional pin to said last scan cell via said multiplexer.

18. In an electronic design automation system, a computer implemented method of constructing a scan chain, said method comprising the steps of:
    a) receiving a netlist description of an integrated circuit design having a plurality of functional pins;
    b) inserting scan cells to said netlist description of said integrated circuit design, said scan cells being coupled serially together to form a scan chain;
    c) placing said scan cells to determine a cell layout for said integrated circuit design, wherein said step (c) is performed using said wirelengths from said scan cells to said plurality of functional pins as constraints, and wherein step (c) is performed without regard to any predetermined constraint designating a functional pin as a scan-in port and without regard to any predetermined constraint designating a functional pin as a scan-out port; and
    d) based on said cell layout of said step (c), selecting a first functional pin of said plurality of functional pins to be a scan-in port of said re-ordered scan chain; and
    e) based on said cell layout of said step (c), selecting a second functional pin of said plurality of functional pins to be a scan-out port of said re-ordered scan chain; and f) modifying said netlist description to couple said first functional pin to a leading scan cell of said scan chain and to couple said second functional pin to a last scan cell of said scan chain.

19. The method as recited in claim 18 wherein said step (c) further comprises the step of re-ordering said scan cells of said scan chain.

20. The method as recited in claim 18 wherein said step (d) further comprises the steps of:

d1) determining a functional pin of said plurality of functional pins that is closest to said leading scan cell; and d2) selecting said first functional pin to be said functional pin determined at step (d1).

21. The method as recited in claim 18 wherein said step (e) further comprises the steps of:

e1) determining a functional pin of said plurality of functional pins that is closest to said last scan cell; and e2) selecting said second functional pin to be said functional pin determined at step (e1).

22. The method as recited in claim 18 wherein said step (f) further comprises the steps of:

f1) inserting a first multiplexer and a second multiplexer within said netlist description;

f2) coupling said first functional pin to said leading scan cell via said first multiplexer; and f3) coupling said second functional pin to said last scan cell via said second multiplexer.

* * * * *